United States Patent
Chen et al.

(10) Patent No.: US 12,094,952 B2
(45) Date of Patent: Sep. 17, 2024

(54) AIR SPACER FORMATION WITH A SPIN-ON DIELECTRIC MATERIAL

(71) Applicant: Taiwan Semiconductor Manufacturing Co., Ltd., Hsinchu (TW)

(72) Inventors: Ting-Ting Chen, New Taipei (TW); Chen-Han Wang, Zhubei (TW); Keng-Chu Lin, Chao-Chou (TW); Shuen-Shin Liang, Hsinchu (TW); Tsu-Hsiu Perng, Zhubei (TW); Tsai-Jung Ho, Xihu (TW); Tsung-Han Ko, New Taipei (TW); Tetsuji Ueno, Hsinchu (TW); Yahru Cheng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/297,831

(22) Filed: Apr. 10, 2023

(65) Prior Publication Data

US 2023/0242115 A1    Aug. 3, 2023

Related U.S. Application Data

(62) Division of application No. 17/192,134, filed on Mar. 4, 2021, now Pat. No. 11,626,482.

(51) Int. Cl.
*H01L 29/49* (2006.01)
*H01L 29/06* (2006.01)
*H01L 29/66* (2006.01)

(52) U.S. Cl.
CPC ...... *H01L 29/4991* (2013.01); *H01L 29/0653* (2013.01); *H01L 29/6656* (2013.01)

(58) Field of Classification Search
CPC .......... H01L 29/6653; H01L 29/66553; H01L 29/6656; H01L 21/7682; H01L 29/4991; H01L 21/76897; H01L 29/0653
See application file for complete search history.

(56) References Cited

U.S. PATENT DOCUMENTS

| 9,105,490 | B2 | 8/2015 | Wang et al. |
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |

(Continued)

*Primary Examiner* — Sonya McCall-Shepard
(74) *Attorney, Agent, or Firm* — Sterne, Kessler, Goldstein & Fox P.L.L.C.

(57) ABSTRACT

The present disclosure describes a method of forming an intermediate spacer structure between a gate structure and a source/drain (S/D) contact structure and removing a top portion of the intermediate spacer structure to form a recess. The intermediate spacer structure includes a first spacer layer, a second spacer layer, and a sacrificial spacer layer between the first spacer layer and the second spacer layer. The method further includes removing the sacrificial spacer layer to form an air gap between the first spacer layer and the second spacer layer and spinning a dielectric layer on the air gap, the first spacer layer, and the second spacer layer to fill in the recess and seal the air gap. The dielectric layer includes raw materials for a spin-on dielectric material.

20 Claims, 11 Drawing Sheets

(56) References Cited

U.S. PATENT DOCUMENTS

| | | | |
|---|---|---|---|
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 10,505,022 B2* | 12/2019 | Chiang | H01L 29/6653 |
| 10,522,642 B2* | 12/2019 | Lee | H01L 29/66583 |
| 10,522,649 B2* | 12/2019 | Cheng | H01L 29/66553 |
| 10,832,962 B1 | 11/2020 | Cheng et al. | |
| 11,362,193 B2 | 6/2022 | Cheng et al. | |
| 2016/0365426 A1* | 12/2016 | Ching | H01L 29/6653 |
| 2019/0165133 A1* | 5/2019 | Jhan | H01L 21/31116 |
| 2019/0296123 A1 | 9/2019 | Lee et al. | |
| 2019/0312123 A1 | 10/2019 | Cheng | |

* cited by examiner

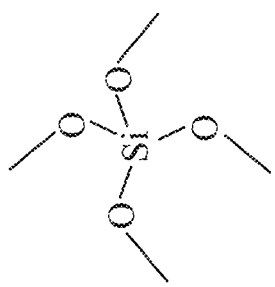
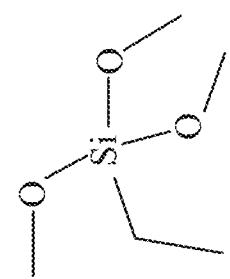

AIR SPACER FORMATION WITH A SPIN-ON DIELECTRIC MATERIAL

CROSS-REFERENCE TO RELATED APPLICATION

This application is a divisional of U.S. Non-Provisional patent application Ser. No. 17/192,134, filed on Mar. 4, 2021, titled "Air Spacer Formation with a Spin-on Dielectric Material," which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

FIGS. 8A-8G illustrate various raw materials to form a semiconductor device with an air spacer sealed by a spin-on dielectric structure, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
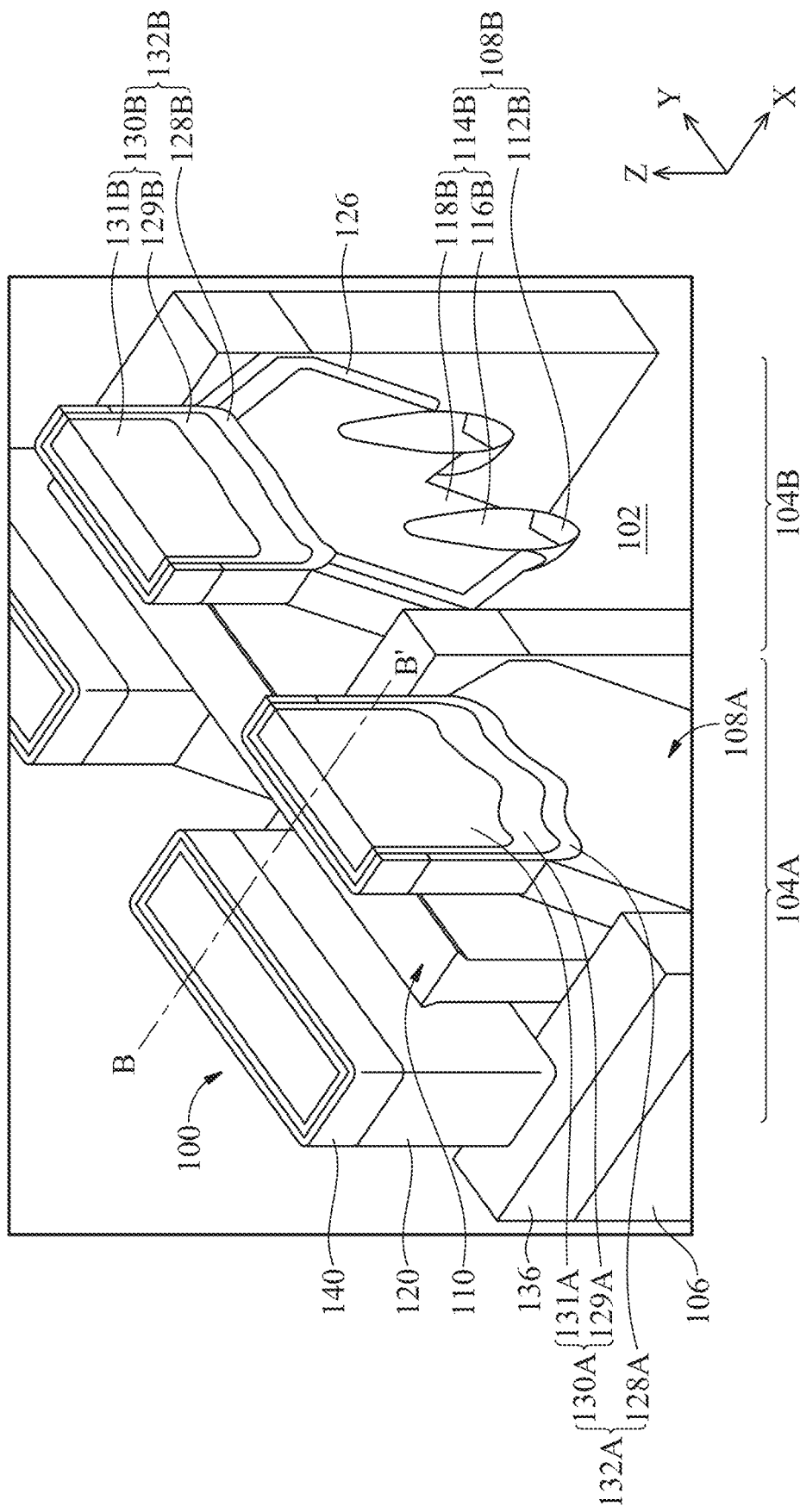
FIGS. 1A and 1B-1D illustrate an isometric view and cross-sectional views of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

As used herein, the term "etch selectivity" refers to the ratio of the etch rates of two different materials under the same etching conditions.

As used herein, the term "substrate" describes a material onto which subsequent material layers are added. The substrate itself may be patterned. Materials added on top of the substrate may be patterned or may remain unpatterned. Furthermore, the substrate may be a wide array of semiconductor materials, such as silicon, germanium, gallium arsenide, indium phosphide, etc. Alternatively, the substrate may be made from an electrically non-conductive material, such as glass and sapphire wafer.

As used herein, the term "high-k" refers to a high dielectric constant. In the field of semiconductor device structures and manufacturing processes, high-k refers to a dielectric constant that is greater than the dielectric constant of $SiO_2$ (e.g., greater than about 3.9).

As used herein, the term "low-k" refers to a small dielectric constant. In the field of semiconductor device structures and manufacturing processes, low-k refers to a dielectric constant that is less than the dielectric constant of $SiO_2$ (e.g., less than about 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "vertical," means nominally perpendicular to the surface of a substrate.

As used herein, the term "horizontal," means nominally parallel to the surface of a substrate.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The performance of semiconductor devices increases with advances in semiconductor technology. For example, complementary metal-oxide-semiconductor (CMOS) transistors are increasingly faster with every new generation of semiconductor technology. One way to improve CMOS transistor speed is to reduce the delay of the device. For example, reducing the resistance-capacitance (RC) delay of the CMOS transistor improves speed and thus device AC performance.

One consideration to reduce the RC delay of a transistor is to use a dielectric with a low dielectric constant (k value). Such a dielectric is also referred to as a "low-k dielectric." For example, the use of a low-k dielectric as a spacer that surrounds a CMOS gate structure can lower a dielectric capacitance between the CMOS gate structure and surrounding portions of the CMOS transistor. With the lower dielectric capacitance, the transistor's RC delay can be reduced and thus the transistor's speed performance can be improved. Compared with other low-k dielectric materials, an air spacer has a lower k value of about 1. Therefore, in some embodiments, the air spacer between the gate structure and the source/drain (S/D) contact structure of the CMOS transistor can provide a lower capacitance, and thus smaller RC delay and faster speed for the CMOS transistor.

Various processes can be used to form an air gap between the gate structure and the S/D contact structure of the CMOS transistor, and a top portion of the air gap can be sealed by a dielectric structure to form the air spacer. The dielectric structure can be deposited by atomic layer deposition (ALD) and chemical vapor deposition (CVD). The dielectric structure deposited by ALD and CVD processes can have challenges. For example, the dielectric structure deposited by ALD and CVD processes can have a seam and degrade the device performance. Further, the dielectric structure deposited by ALD and CVD processes may not have a planarized surface, which increases the difficulty for subsequent polishing processes. In addition, the dimensions of the air spacer sealed by the dielectric structure are controlled by an incoming etch profile of the air gap and sidewall step coverages of these deposition processes. These deposition processes may not have consistent and uniform control of the air spacer dimensions across multiple transistors.

Various embodiments in accordance with the present disclosure provide methods for forming an air spacer with a spin-on dielectric structure. An air gap can be formed between the gate structure and the S/D contact structure through deposition and removal of a sacrificial spacer layer. In some embodiments, the spin-on dielectric structure can seal a top opening of the air gap and form the air spacer. The spin-on dielectric structure can be formed through spinning a dielectric layer on the air gap and treating the dielectric layer. The spin-on dielectric structure can have substantially no seam after formation. Compared with ALD and CVD processes, the dielectric layer deposited by a spin-on process can have a planarized surface that can lower the difficulty of subsequent polishing processes. In some embodiments, the spin-on process may not fill openings having a width less than about 7 nm, and a recess can be formed in the sacrificial spacer layer and adjacent spacer layers to control the air spacer dimensions.

Figure 1B:
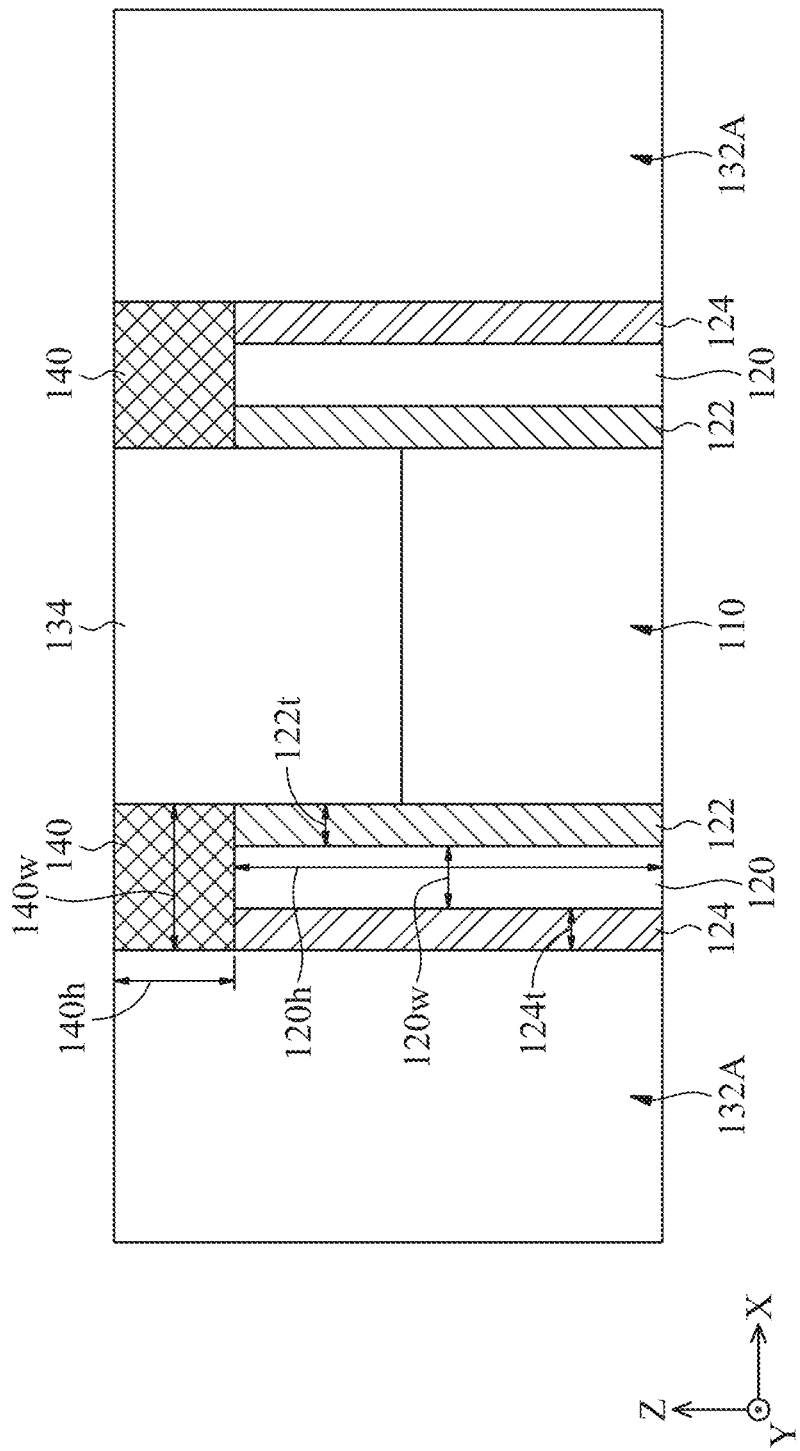
Figure 1C:
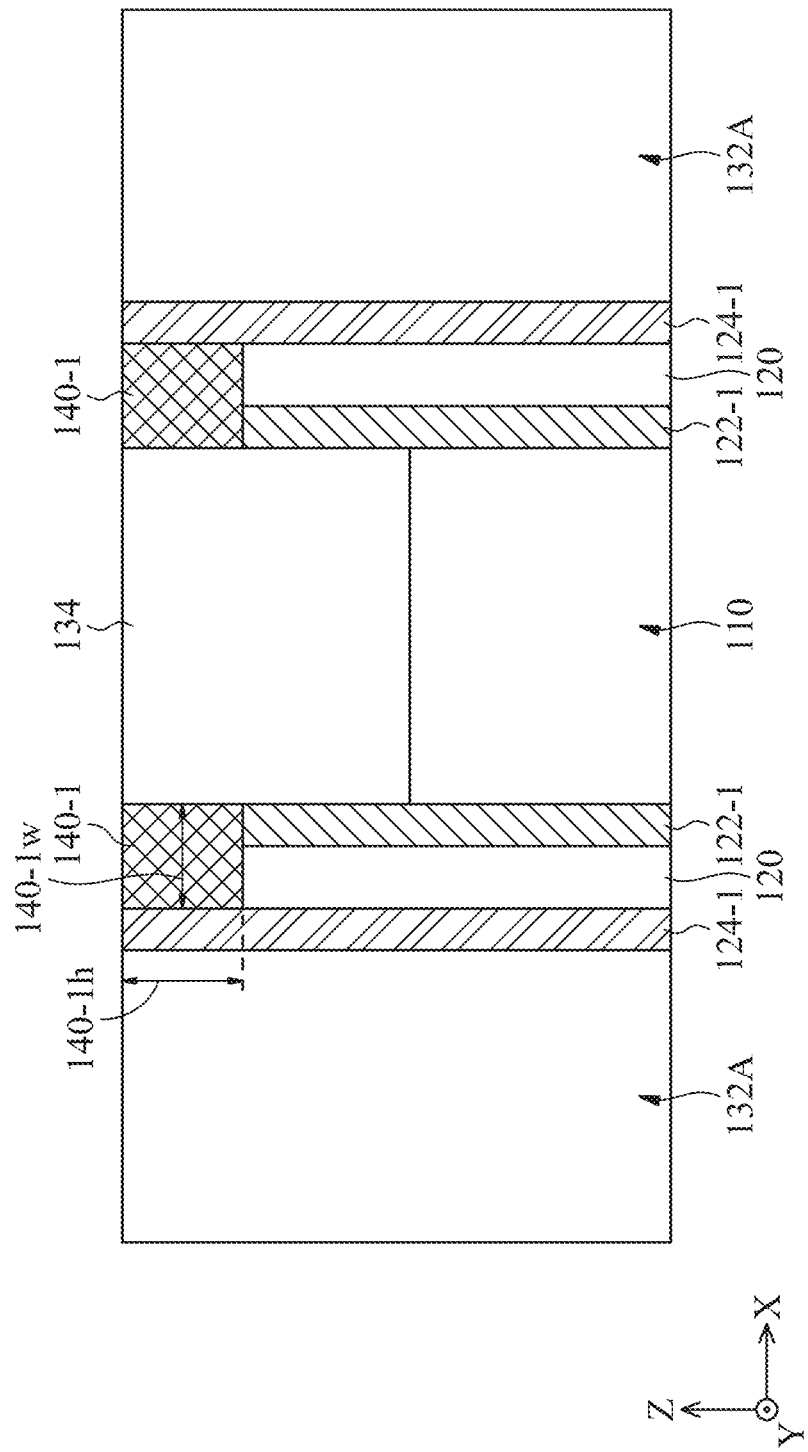
Figure 1D:
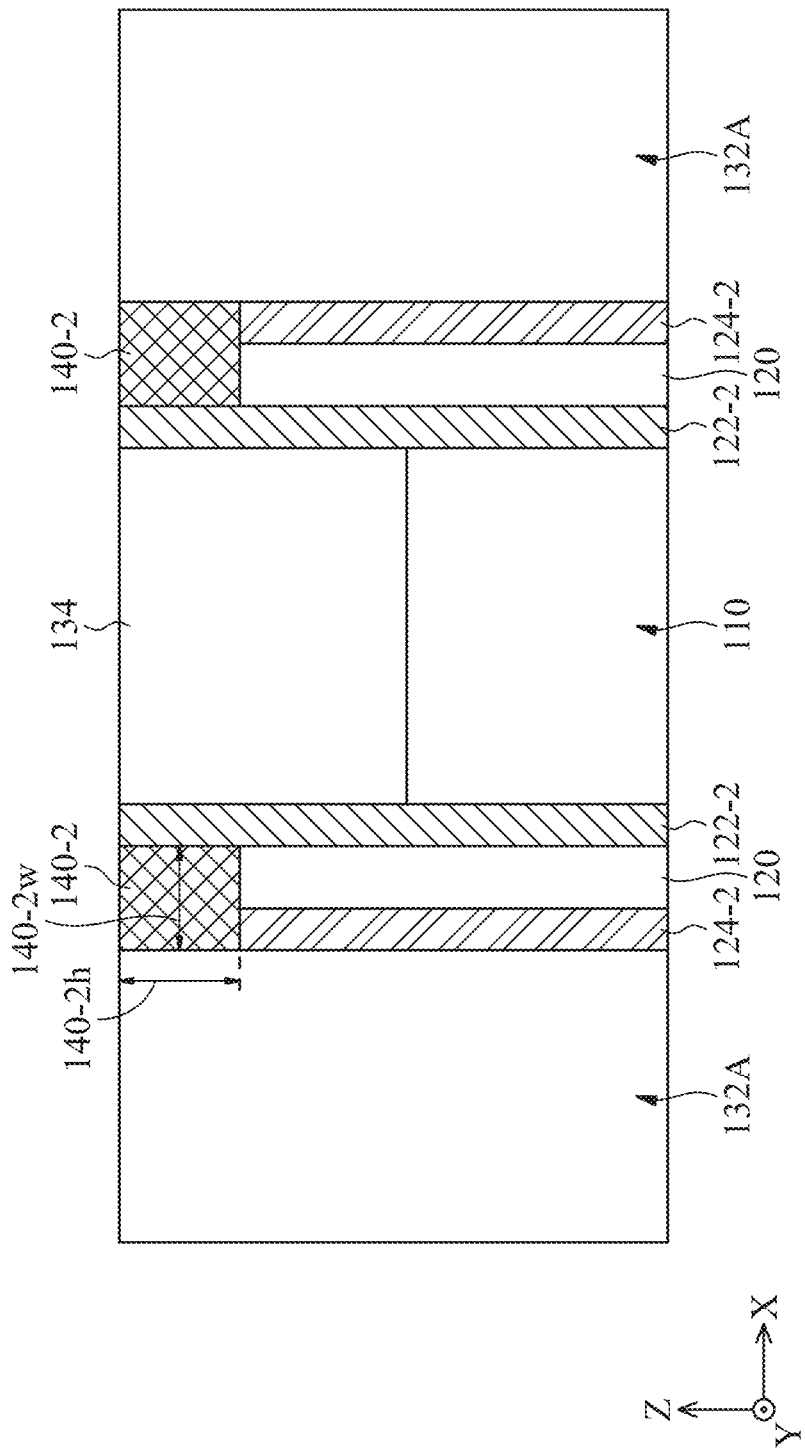

FIG. 1A illustrates a partial isometric view of a semiconductor device 100 with air spacers 120 sealed by spin-on dielectric structures 140, in accordance with some embodiments. FIG. 1B illustrates a partial cross-sectional view along line B-B' of semiconductor device 100 with air spacers 120 sealed by spin-on dielectric structures 140, in accordance with some embodiments. FIGS. 1C and 1D illustrate partial cross-sectional views along line B-B' of semiconductor device 100 with air spacers 120 sealed by spin-on dielectric structures 140-1 and 140-2 respectively, in accordance with some embodiments. In some embodiments, FIGS. 1A-1D show a portion of an integrated circuit where the spacing between the fin structures (e.g., the fin pitch), the dimensions of the fin structures, and the dimensions of the gate structures in the integrated circuit can be similar or different from the ones shown in FIGS. 1A-1D. Additionally, the isometric and cross-sectional views of semiconductor device 100 in FIGS. 1A-1D and the subsequent figures are for illustrative purposes.

Referring to FIGS. 1A and 1B, semiconductor device 100 can be formed on a substrate 102 and can include finFETs 104A and 104B. In some embodiments, finFET 104A can be an NFET (also referred to as "NFET 104A") and finFET 104B can be a PFET (also referred to as "PFET 104B"). Though FIGS. 1A and 1B show a single NFET 104A and a single PFET 104B for simplicity, semiconductor device 100 can have any number of NFETs similar to NFET 104A and any number of PFETs similar to PFET 104B. Also, though FIGS. 1A and 1B show a single gate structure 110, semiconductor device 100 can have additional gate structures similar and parallel to gate structure 110. In addition, semiconductor device 100 can be incorporated into an integrated circuit through the use of other structural components, such as gate contact structures, conductive vias, conductive lines, dielectric layers, and passivation layers, that are not shown for simplicity. The discussion of elements of finFETs 104A and 104B with the same annotations applies to each other, unless mentioned otherwise. Semiconductor device 100 can further include shallow trench isolation (STI) regions 106, fin structures 108A and 108B, gate structure 110, a gate capping structure 134, S/D contact structures 132A and 132B, an etch stop layer (ESL) 126, and an interlayer dielectric (ILD) layer 136.

FinFETs 104A and 104B can be formed on a substrate 102. Substrate 102 can be a semiconductor material, such as silicon. In some embodiments, substrate 102 can include a crystalline silicon substrate (e.g., wafer). In some embodiments, substrate 102 can include (i) an elementary semiconductor, such as germanium (Ge); (ii) a compound semiconductor, such as silicon carbide (SiC); (iii) an alloy semiconductor, such as silicon germanium (SiGe); (iv) a silicon-on-insulator (SOI) structure; (v) a silicon germanium (SiGe)-on insulator structure (SiGeOI); (vi) germanium-on-insulator (GeOI) structure; and (vii) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic).

STI regions 106 can provide electrical isolation between finFETs 104A and 104B from each other and from neighboring finFETs with different fin structures (not shown) on substrate 102 and/or neighboring active and passive elements (not shown) integrated with or deposited on substrate 102. STI regions 106 can be made of a dielectric material. In some embodiments, STI regions 106 can include silicon oxide, silicon nitride, silicon oxynitride, fluorine-doped silicate glass (FSG), a low-k dielectric material, and/or other suitable insulating materials. In some embodiments, STI regions 106 can include a multi-layered structure.

Fin structures 108A of NFET 104A and 108B of PFET 104B can extend along an X-axis and through gate structure 110. Fin structures 108A and 108B can include fin base regions and can also include epitaxial fin regions disposed on fin base regions, respectively, such as fin base regions 112B and epitaxial fin regions 114B. Portions of the fin base regions extending above STI regions 106 can be wrapped around by gate structure 110 (not shown). In some embodiments, the fin base regions can include materials similar to substrate 102.

In some embodiments, the epitaxial fin regions can be grown on portions of the respective fin base regions that are not underlying gate structure 110, as illustrated in FIG. 1A. The epitaxial fin regions can include multiple fin sub-regions, such as first epitaxial fin sub-region 116B and second epitaxial fin sub-region 118B. In some embodiments, the epitaxial fin regions of NFET 104A and PFET 104B on different fin base regions can merge with adjacent epitaxial fin regions, respectively, as shown in FIG. 1A. In some embodiments, the epitaxial fin regions can be unmerged (not shown) from adjacent epitaxial fin regions on separate fin base regions. The epitaxial fin regions can include an epitaxially-grown semiconductor material.

Referring to FIG. 1A, fin structures 108A and 108B can be current-carrying structures for respective finFETs 104A and 104B. The epitaxial fin regions of finFETs 104A and 104B can function as source/drain (S/D) regions. Channel regions of finFETs 104A and 104B can be formed in portions of their respective fin base regions underlying gate structure 110.

Gate structure 110 can include a gate dielectric layer and a gate electrode. Gate structure 110 can be formed by a gate replacement process. In some embodiments, the gate dielectric layer is adjacent to and in contact with the gate electrode. The gate dielectric layer can include an interfacial oxide layer and a high-k gate dielectric layer. The gate electrode can include a gate barrier layer, a gate work function metal layer, and a gate metal fill layer. In some embodiments, the gate work function metal layer can include a single metal layer or a stack of metal layers. The stack of metal layers can include metals having work functions similar to or different from each other. The gate metal fill layer can also include a single metal layer or a stack of metal layers. The stack of metal layers can include metals different from each other. In some embodiments, gate structure 110 can have a thickness along a Z-axis ranging from about 3 nm to about 30 nm.

Referring to FIG. 1B, gate capping structure 134 can be disposed on gate structure 110 and configured to protect underlying structures and/or layers during subsequent processing of semiconductor device 100. For example, gate capping structure 134 can act as an etch stop layer during the formation of S/D contact structures 132A and 132B. Gate capping structure 134 can include one or more layers of insulating material having (i) a nitride-based material, such as silicon nitride; (ii) a carbide-based material, such as silicon carbide; (iii) an elementary semiconductor, such as silicon; (iv) a metal oxide-based material; or (v) a combination thereof. In some embodiments, gate capping structure 134 can include a stack of layers of insulating material, where each layer of the stack can have a material and dimensions different from other layers in the stack. In some embodiments, gate capping structure 134 can have a thickness along a Z-axis ranging from about 3 nm to about 30 nm. Gate capping structure 134 is omitted in FIG. 1A merely for clarity and ease of description.

Referring to FIG. 1A, ESL 126 can be formed on the epitaxial fin regions of NFET 104A and PFET 104B and protect portions of the epitaxial fin regions that are not in contact with S/D contact structures 132A and 132B. This protection can be provided, for example, during formation of ILD layer 136 and/or S/D contact structures 132A and 132B. In some embodiments, ESL 126 can include, for example, silicon nitride ($SiN_x$), silicon oxide ($SiO_x$), silicon oxynitride (SiON), or a combination thereof.

ILD layer 136 can be disposed on ESL 126 and STI regions 106. ILD layer 136 can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). In some embodiments, the dielectric material can be silicon oxide.

S/D contact structures 132A and 132B can electrically connect respective S/D regions (e.g., epitaxial fin regions) of finFETs 104A and 104B to other elements of semiconductor device 100 and/or of the integrated circuit. S/D contact structures 132A and 132B can be formed within ILD layer 136. According to some embodiments, S/D contact structures 132A and 132B of NFET 104A and PFET 104B can include metal silicide layers 128A-128B and conductive regions 130A-130B disposed on metal silicide layers 128A-128B, respectively.

In some embodiments, metal silicide layers 128A-128B can include metal silicide and can provide a low resistance interface between respective conductive regions 130A-130B and corresponding S/D regions of finFETs 104A and 104B. Examples of metal used for forming the metal silicide are Co, Ti, and Ni.

In some embodiments, conductive regions 130A-130B can further include metal capping layers 129A-129B and metal layers 131A-131B, respectively. Metal capping layers 129A and 129B can be configured as diffusion barriers to prevent oxidation of metal silicide layers 128A-128B and diffusion of other unwanted atoms and/or ions into metal silicide layers 128A-128B during formation of conductive regions 130A-130B. In some embodiments, metal capping layers 129A and 129B can include a single layer or a stack of conductive materials, such as TiN, Ti, Ni, TiSiN, TaN, Ta, and a combination thereof. In some embodiments, metal capping layers 129A and 129B can act as an adhesionpromoting-layer, a glue-layer, a primer-layer, a protective-layer, and/or a nucleation-layer. In some embodiments, metal layers 131A and 131B can include conductive materials, such as W, Al, and Co.

Referring to FIGS. 1A and 1B, semiconductor device 100 can further include a first spacer layer 122, a second spacer layer 124, air spacers 120, and spin-on dielectric structures 140, according to some embodiments. In some embodiments, first spacer layer 122, second spacer layer 124, air spacers 120, and spin-on dielectric structures 140 can be collectively referred to as "a spacer structure," which is between gate structure 110 and S/D contact structures 132A and 132B.

First spacer layer 122 can be formed on sidewalls of gate structure 110 and between gate structure 110 and air spacers 120. First spacer layer 122 can be in contact with gate capping structure 134. First spacer layer 122 can include insulating materials, such as silicon oxide, a low-k material, and a combination thereof. First spacer layer 122 can have a low-k material with a dielectric constant less than 3.9 (e.g., less than 3.5, 3, or 2.8). In some embodiments, first spacer layer 122 can include a single layer or multiple layers of insulating materials. In some embodiments, first spacer layer 122 can isolate gate structure 110 and source/drain (S/D) contact structures 132A and 132B. In some embodiments, first spacer layer 122 can have a thickness 122t along an X-axis ranging from about 1 nm to about 5 nm.

Second spacer layer 124 can be formed between air spacers 120 and S/D contact structures 132A and 132B. Second spacer layer 124 can prevent silicide extrusion into air spacers 120 and damage of epitaxial fin regions of NFET 104A and PFET 104B. Silicide extrusion into air spacers 120 can reduce the volume in air spacers 120, thus increasing the capacitance between gate structure 110 and S/D contact structures 132A and 132B and decreasing the device AC performance. This protection can be provided, for example, during formation of air spacers 120. In some embodiments, second spacer layer 124 can include, for example, silicon nitride ($SiN_x$), silicon oxynitride (SiON), silicon carbide (SiC), silicon carbonitride (SiCN), or a combination thereof. In some embodiments, second spacer layer 124 can have a thickness 124t along an X-axis ranging from about 1 nm to about 5 nm.

Air spacers 120 can be formed between first spacer layer 122 and second spacer layer 124, as shown in FIG. 1B. In some embodiments, air spacers 120 can surround S/D contact structures 132A and 132B. In some embodiments, air spacers 120 can be filled with air and can have a dielectric constant of about 1 to reduce the dielectric constant and capacitance of the spacer structure between gate structure 110 and S/D contact structures 132A and 132B, thus improving device AC performance.

In some embodiments, the horizontal dimension and vertical dimension of air spacers 120 can be tuned to further reduce the capacitance of the spacer structure between gate structure 110 and S/D contact structures 132A and 132B. In some embodiments, the horizontal dimension of air spacers 120 can be tuned by a thickness of a sacrificial spacer layer to form air spacers 120. In some embodiments, the vertical dimension of air spacers 120 can be tuned by spin-on dielectric structures 140. In some embodiments, air spacers 120 can have a horizontal dimension along an X-axis (e.g., width) 120w ranging from about 1 nm to about 7 nm. If horizontal dimension 120w is smaller than about 1 nm, air spacers 120 may not reduce the capacitance of the spacer structure and the device AC performance (e.g., speed) may not be improved. If horizontal dimension 120w is larger than about 7 nm, spin-on dielectric structures 140 can fill in air spacers 120. In some embodiments, ratios of 120w to 122t and 124t can range from about 0.2 to about 5. If the ratios are less than about 0.2, air spacers 120 may not reduce the capacitance of the spacer structure and the device AC performance (e.g., speed) may not be improved. If the ratios are greater than about 5, spin-on dielectric structures 140 can fill in air spacers 120, and first and second spacer layers 122 and 124 may not isolate gate structure 110 source/drain (S/D) and contact structures 132A and 132B. The capacitance of the spacer structure between gate structure 110 and S/D contact structures 132A and 132B may increase and, as a result, the device AC performance may not be improved. In some embodiments, air spacers 120 can have a vertical dimension along a Z-axis (e.g., height) 120h ranging from about 8 nm to about 48 nm. If vertical dimension 120h is smaller than about 8 nm, the device AC performance may not be improved. If vertical dimension 120h is larger than about 48 nm, corner rounding may occur during dummy spacer etching to form air spacers 120.

Spin-on dielectric structures 140 can be formed on air spacers 120, gate capping structure 134, and S/D contact structures 132A and 132B. Spin-on dielectric structures 140, together with first spacer layer 122 and second spacer layer 124, can seal an air gap in air spacers 120. In some embodiments, spin-on dielectric structures 140 can be formed by a spin-on process and a post-treatment process. In some embodiments, spin-on dielectric structures 140 can have a vertical dimension along a Z-axis (e.g., height) 140h ranging from about 2 nm to about 10 nm. In some embodiments, a height of the spacer structure (e.g., a sum of 140h and 120h) can range from about 10 nm to about 50 nm. A ratio of 140h to the height of the spacer structure (e.g., a sum of 140h and 120h) can range from about 0.04 to about 0.6. If 140h is greater than about 10 nm or the ratio is greater than about 0.6, 120h of air spacers 120 can be smaller and the device AC performance may not be improved. If 140h is less than about 2 nm or the ratio is less than about 0.01, air spacers 120 may not be properly sealed by spin-on dielectric structures 140. In some embodiments, spin-on dielectric structures 140 can have a horizontal dimension along an X-axis (e.g., width) 140w ranging from about 7 nm to about 16 nm. If 140w is greater than 16 nm, the dimensions of S/D contact structures 132A and 132B can be reduced and the resistance of S/D contact structures 132A and 132B may increase. If 140w is less than 7 nm, spin-on dielectric structures 140 may not be properly formed, as a spin-on dielectric layer may not fill an opening less than about 7 nm.

In some embodiments, spin-on dielectric structures 140 can include a spin-on dielectric material that includes silicon (Si), oxygen (O), carbon (C), hydrogen (H), and fluorine (F). In some embodiments, the spin-on dielectric material can include carbosilanes with Si—$CH_2$—Si or Si—CH—Si bridging groups. In some embodiments, the spin-on dielectric material can include methyl groups (—$CH_3$) or ethyl groups (—$CH_2CH_3$). In some embodiments, the C concentration in the spin-on dielectric material can range from about 2 atomic percent to about 30 atomic percent. In some embodiments, C can improve the etch selectivity between the spin-on dielectric material and adjacent structures. The spin-on dielectric material with higher C concentration can be harder to etch. If the carbon concentration is lower than 2 atomic percent, the spin-on dielectric material can be damaged during subsequent processes, such as etching processes. If the carbon concentration is higher than 30 atomic percent, the spin-on dielectric material may not be etched properly during formation of spin-on dielectric structures 140.

In some embodiments, the F concentration in the spin-on dielectric material can range from about 0 atomic percent to about 10 atomic percent. F can be introduced to the spin-on dielectric material from surfactant materials during formation of spin-on dielectric structures 140. The surfactant materials, which may contain F, can improve coating uniformity of the spin-on dielectric material. In some embodiments, the F can be partially removed by the post-treatment process. In some embodiments, the remaining F concentration in the spin-on dielectric material can be up to about 10 atomic percent. If the F concentration is higher than about 10 atomic percent, the F in the spin-on dielectric material may damage S/D contact structures 132A and 132B.

In some embodiments, an O to Si ratio (O/Si ratio) in the spin-on dielectric material can range from about 1.5 to about 3.0. The O/Si ratio can be controlled by raw materials used to form the spin-on dielectric material. The O/Si ratio can affect the dielectric constant of the spin-on dielectric material. If the O/Si ratio is higher than about 3.0, the dielectric constant can be higher and the device AC performance may not be improved. If the O/Si ratio is lower than about 1.5, the spin-on dielectric material may not be etched properly during formation of spin-on dielectric structures 140.

In some embodiments, the dielectric constant of the spin-on dielectric material can range from about 2 to about 5. If the dielectric constant is higher than about 5, the capacitance of the spacer structure between gate structure 110 and S/D contact structures 132A and 132B can be higher and the device AC performance may not be improved. If the dielectric constant is lower than about 2, the spin-on dielectric material may not be compatible with subsequent processes.

In some embodiments, the density of the spin-on dielectric material can range from about 1.2 g/cm$^3$ to about 2.3 g/cm$^3$. If the density is lower than about 1.2 g/cm$^3$, the spin-on dielectric material can be damaged during subsequent processes, such as etching processes. If the density is higher than about 2.3 g/cm$^3$, the anneal temperature to form the spin-on dielectric material can be too high and damage gate structure 110.

FIGS. 1C and 1D illustrate cross-sectional views of semiconductor device 100, in accordance with some embodiments. In some embodiments, a top surface of first spacer layer 122-1 can be in contact with a bottom surface of spin-on dielectric structures 140-1 and a top surface of second spacer layer 124-1 can be above the bottom surface of spin-on dielectric structures 140-1, as shown in FIG. 1C. In some embodiments, a top surface of second spacer layer 124-2 can be in contact with a bottom surface of spin-on dielectric structures 140-2 and a top surface of first spacer layer 122-2 can be above the bottom surface of spin-on dielectric structures 140-2, as shown in FIG. 1D. Different profiles of the spacer structure between gate structure 110 and S/D contact structures 132A and 132B can be formed by selectively etching first spacer layer 122-1 or second spacer layer 124-2 during the formation of spin-on dielectric structures 140-1 or 140-2 respectively. In some embodiments, second spacer layer 124-1 in FIG. 1C can provide a better barrier between S/D contact structures 132A and spin-on dielectric structures 140-1. In some embodiments, first spacer layer 122-2 in FIG. 1D can prevent diffusion of spin-on dielectric structures 140-2 to gate structure 110.

Air spacers 120 in FIGS. 1C and 1D can have similar dimensions as in FIG. 1B. In some embodiments, spin-on dielectric structures 140-1 and 140-2 can have vertical dimensions along a Z-axis (e.g., height) 140-1h and 140-2h respectively, each ranging from about 2 nm to about 10 nm. If 140-1h or 140-2h is greater than 10 nm, 120h of air spacers 120 can be reduced and the device AC performance may not be improved. If 140-1h or 140-2h is less than 2 nm, air spacers 120 may not be properly sealed by spin-on dielectric structure 140-1 or 140-2 respectively. In some embodiments, spin-on dielectric structures 140-1 and 140-2 can have horizontal dimensions along an X-axis (e.g., width) 140-1w and 140-2w ranging from about 7 nm to about 16 nm respectively. If 140-1w or 140-2w is greater than 16 nm, second spacer layer 124-1 or first spacer layer 122-2 may be etched during the selectively etching process, respectively. If 140-1w or 140-2w is less than 7 nm, spin-on dielectric structure 140-1 or 140-2 may not be properly formed, as a spin-on dielectric layer may not fill an opening having a width less than about 7 nm.

Figure 2:
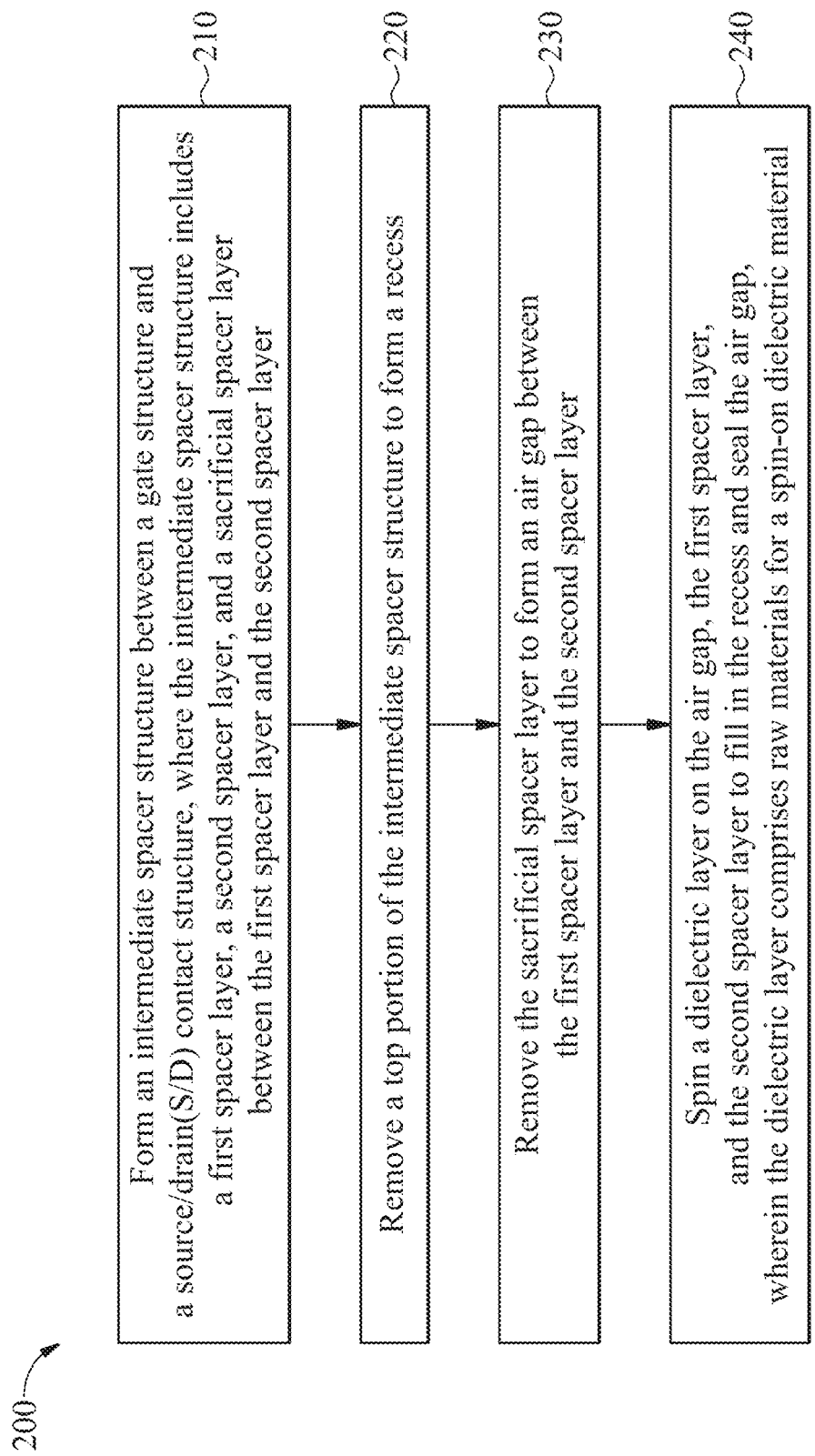
FIG. 2 is a flow diagram of a method for fabricating a semiconductor device with an air spacer sealed by a spin-on dielectric structure, in accordance with some embodiments.

FIG. 2 is a flow diagram of a method 200 for fabricating semiconductor device 100 with an air spacer sealed by a spin-on dielectric structure, in accordance with some embodiments. Additional fabrication operations may be performed between various operations of method 200 and may be omitted merely for clarity and ease of description. Additionally, some of the operations may be performed simultaneously, or in a different order than the ones shown in FIG. 2. Accordingly, additional processes can be provided before, during, and/or after method 200; these additional processes can be briefly described herein. For illustrative purposes, the operations illustrated in FIG. 2 will be described with reference to the example fabrication process for fabricating semiconductor device 100 as illustrated in FIGS. 3-7. FIGS. 3-7 are cross-sectional views of semiconductor device 100 along line B-B' (of FIG. 1A) at various stages of its fabrication, according to some embodiments. Although FIGS. 3-7 illustrate fabrication process of spin-on dielectric structures 140 on NFET 104A, method 200 can be applied to PFET 104B and other devices. Elements in FIGS. 3-7 with the same annotations as elements in FIGS. 1A and 1B are described above.

Figure 3:
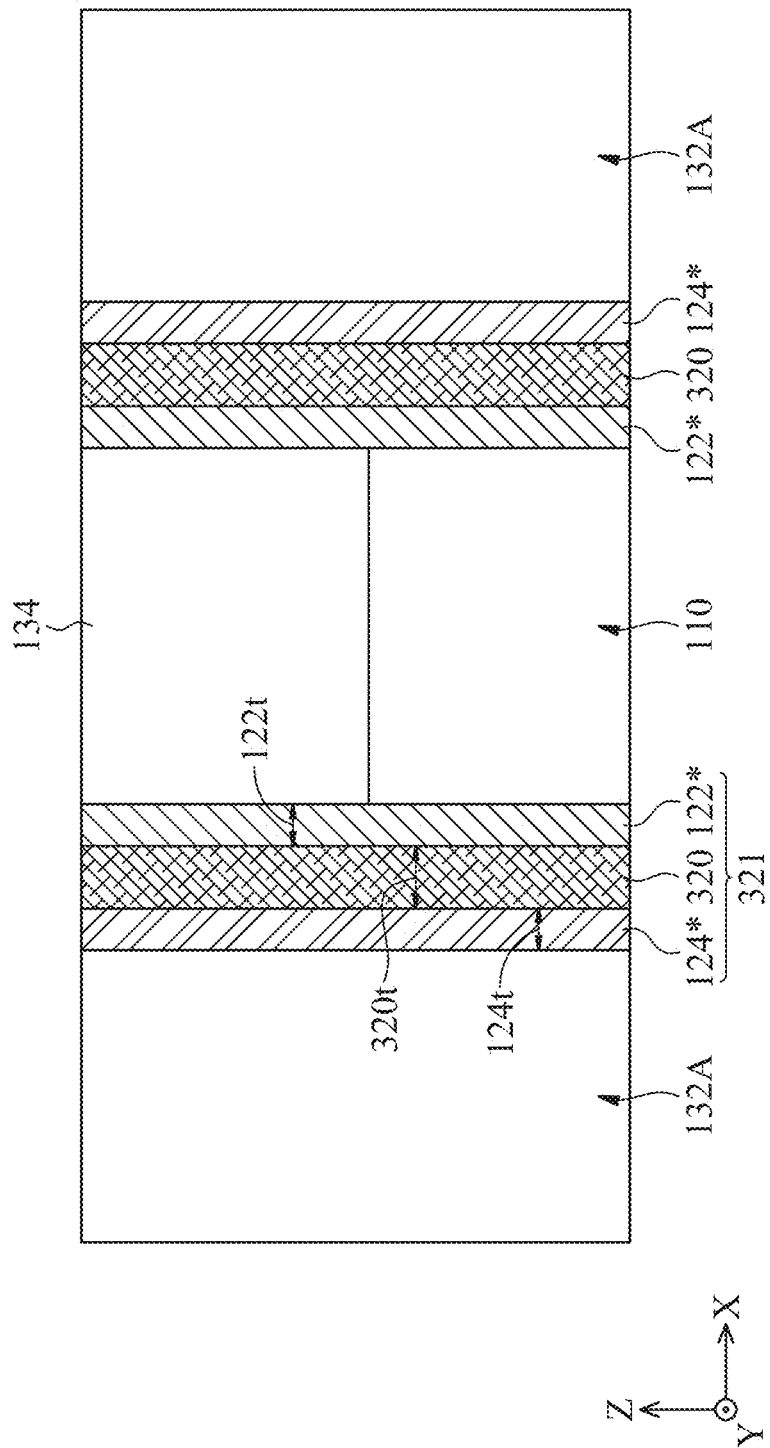
FIGS. 3-7 illustrate cross-sectional views of a semiconductor device with an air spacer sealed by a spin-on dielectric structure at various stages of its fabrication process, in accordance with some embodiments.

In referring to FIG. 2, method 200 begins with operation 210 and the process of forming an intermediate spacer structure between a gate structure and a source/drain (S/D) contact structure. The intermediate spacer structure includes a first spacer layer, a second spacer layer, and a sacrificial spacer layer between the first spacer layer and the second spacer layer. For example, as shown in FIG. 3, intermediate spacer structure 321 can be formed between gate structure 110 and S/D contact structures 132A. Intermediate spacer structure 321 can include first spacer layer 122*, sacrificial spacer layer 320, and second spacer layer 124*. First spacer layer 122* can be deposited on sidewalls of gate structure 110. In some embodiments, first spacer layer 122* can be blanket deposited on gate structure 110 and fin structures, followed by performing a photolithography process on and etching portions of the deposited first spacer layer 122* and underlying fin structures. The deposition process can include CVD, ALD, physical vapor deposition (PVD), other suitable deposition methods, or a combination thereof. The photolithography can include masking a portion of semiconductor device 100 (e.g., p-type MOSFET) to etch the other portion of semiconductor device 100 (e.g., n-type MOSFET). The etching process can include dry etching and/or other directional etching methods (e.g., reactive ion etching). In some embodiments, first spacer layer 122* can have a thickness 122t ranging from about 1 nm to about 5 nm.

The formation of first spacer layer 122* can be followed by the formation of sacrificial spacer layer 320 on first spacer layer 122*. In some embodiments, the formation of sacrificial spacer layer 320 can include conformally depositing a spacer layer and etching portions of the spacer layer to form sacrificial spacer layer 320. In some embodiments, the spacer layer can be conformally deposited by CVD and/or other suitable deposition methods. In some embodiments, the conformally deposited spacer layer can be etched using a dry etching process to form sacrificial spacer layer 320. In some embodiments, sacrificial spacer layer 320 can have a thickness 320t ranging from about 2 nm to about 5 nm. In some embodiments, the thickness of sacrificial spacer layer 320 can tune the horizontal dimension 120w of subsequently-formed air spacers 120.

The formation of sacrificial spacer layer 320 can be followed by the formation of second spacer layer 124* on sacrificial spacer layer 320. In some embodiments, the formation of second spacer layer 124* can include conformally depositing a spacer layer and etching portions of the spacer layer to form second spacer layer 124*. In some embodiments, second spacer layer 124* can include silicon nitride and/or other dielectric materials. In some embodiments, the spacer layer can be conformally deposited by CVD, ALD, and/or other suitable deposition methods. In some embodiments, the conformally deposited spacer layer can be etched using a dry etching process to form second spacer layer 124*. In some embodiments, second spacer layer 124* can have a thickness 124t ranging from about 1 nm to about 5 nm.

Figure 4:
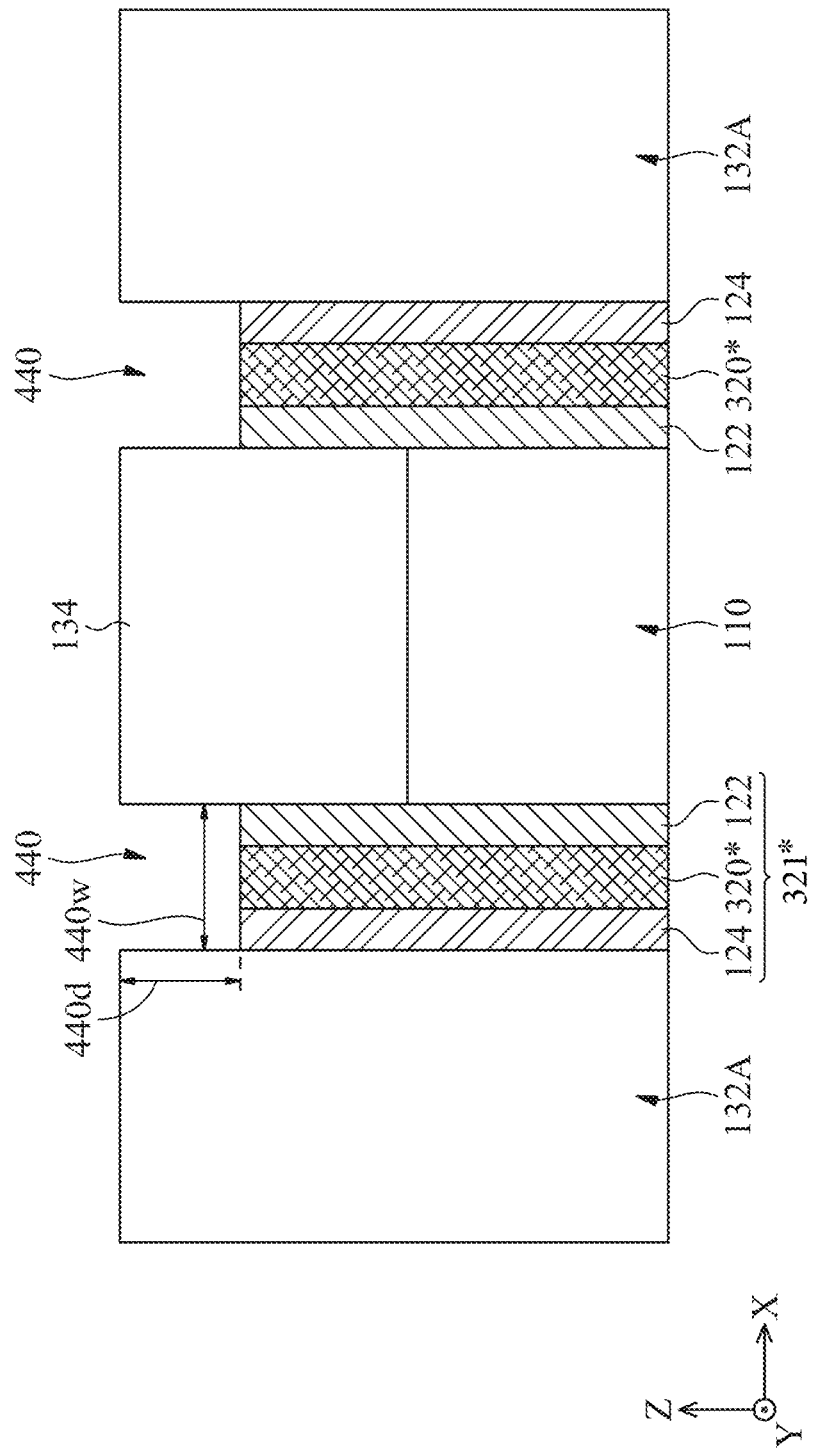

Referring to FIG. 2, in operation 220, a top portion of the intermediate spacer structure can be removed to form a recess. For example, as shown in FIG. 4, a top portion of intermediate spacer structure 321 can be removed to form a recess 440 and intermediate spacer structure 321*. In some embodiments, first spacer layer 122*, sacrificial spacer layer 320, and second spacer layer 124* can be removed at a depth 440d along a Z-axis ranging from about 5 nm to about 10 nm. In some embodiments, depth 440d of recess 440 can control the vertical dimension 140h of subsequently-formed spin-on dielectric structures 140. In some embodiments, a larger depth 440d can lead to a larger vertical dimension 140h. In some embodiments, recess 440 can have a width 440w along an X-axis ranging from about 7 nm to about 15 nm, as the subsequent spin-on process may not fill an opening having a width less than about 7 nm.

First spacer layer 122*, sacrificial spacer layer 320, and second spacer layer 124* can be selectively etched to form different recess profiles and thus different profiles of spin-on dielectric structures 140. In some embodiments, the selectively etching process can have high etch selectivity between first spacer layer 122* and second spacer layer 124*. In some embodiments, first spacer layer 122* and sacrificial spacer layer 320 can be selectively etched to form a profile of spin-on dielectric structures 140-1 as shown in FIG. 1C. In some embodiments, second spacer layer 124* and sacrificial spacer layer 320 can be selectively etched to form a profile of spin-on dielectric structures 140-2 as shown in FIG. 1D. In some embodiments, after the etching process, top surface of first spacer layer 122, sacrificial spacer layer 320*, and second spacer layer 124 may be curved due to etching process variations.

Figure 5:
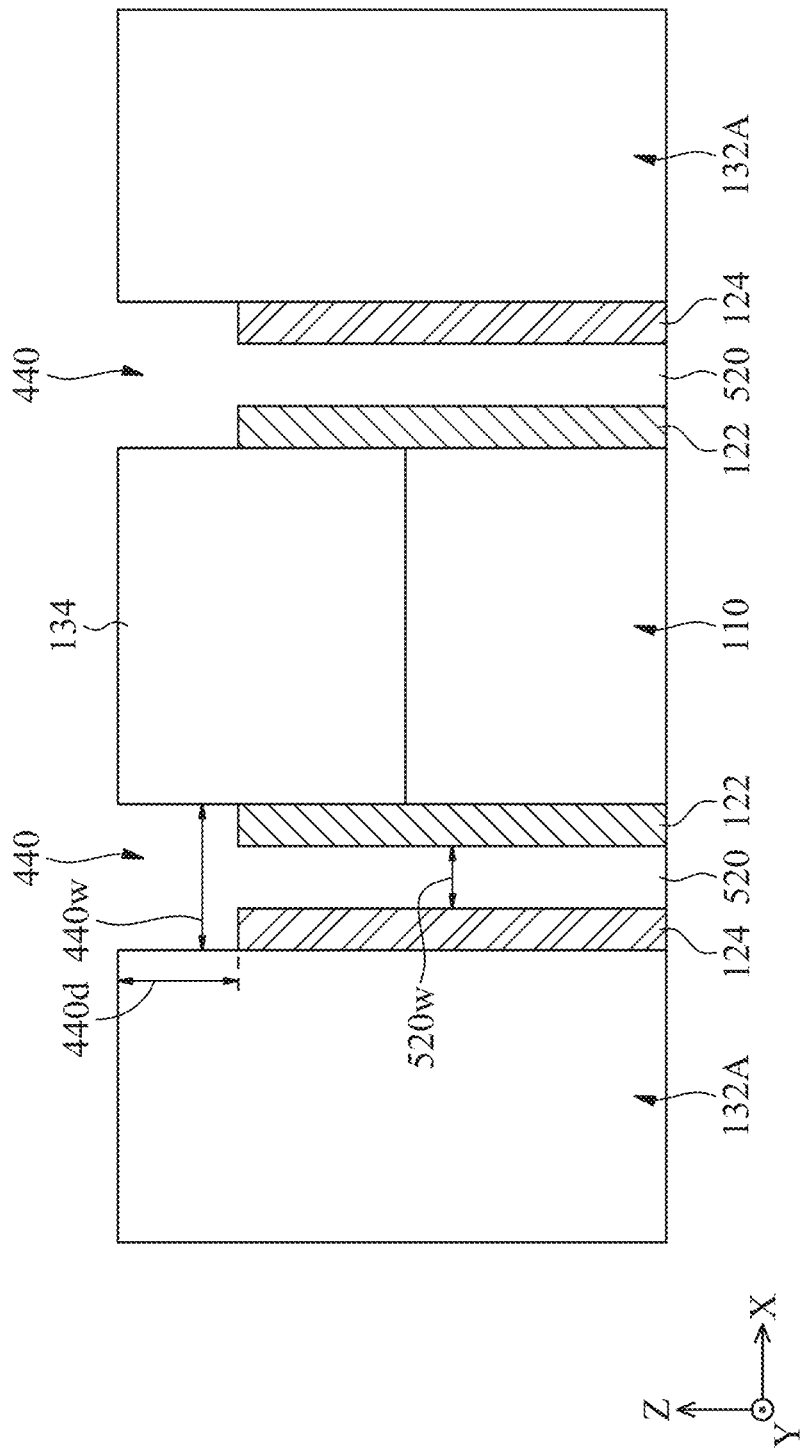

Referring to FIG. 2, in operation 230, the sacrificial spacer layer is removed to form an air gap between the first spacer layer and the second spacer layer. For example, as shown in FIG. 5, the sacrificial spacer layer 320* can be removed to form an air gap 520 between first spacer layer 122 and second spacer layer 124. In some embodiments, the formation of air gap 520 can include an etch process. In some embodiments, the etch process can include a dry etching process. In some embodiments, the dry etching process can include using a fluorine- or chlorine-based etchant mixed with hydrogen or oxygen. After the etch process, sacrificial spacer layer 320* can be removed and air gap 520 can be formed between first spacer layer 122 and second spacer layer 124. Air gap 520 can have a width 520w along an X-axis ranging from about 2 nm to about 5 nm. In some embodiments, width 520w can be the same as thickness 320t.

Figure 6:
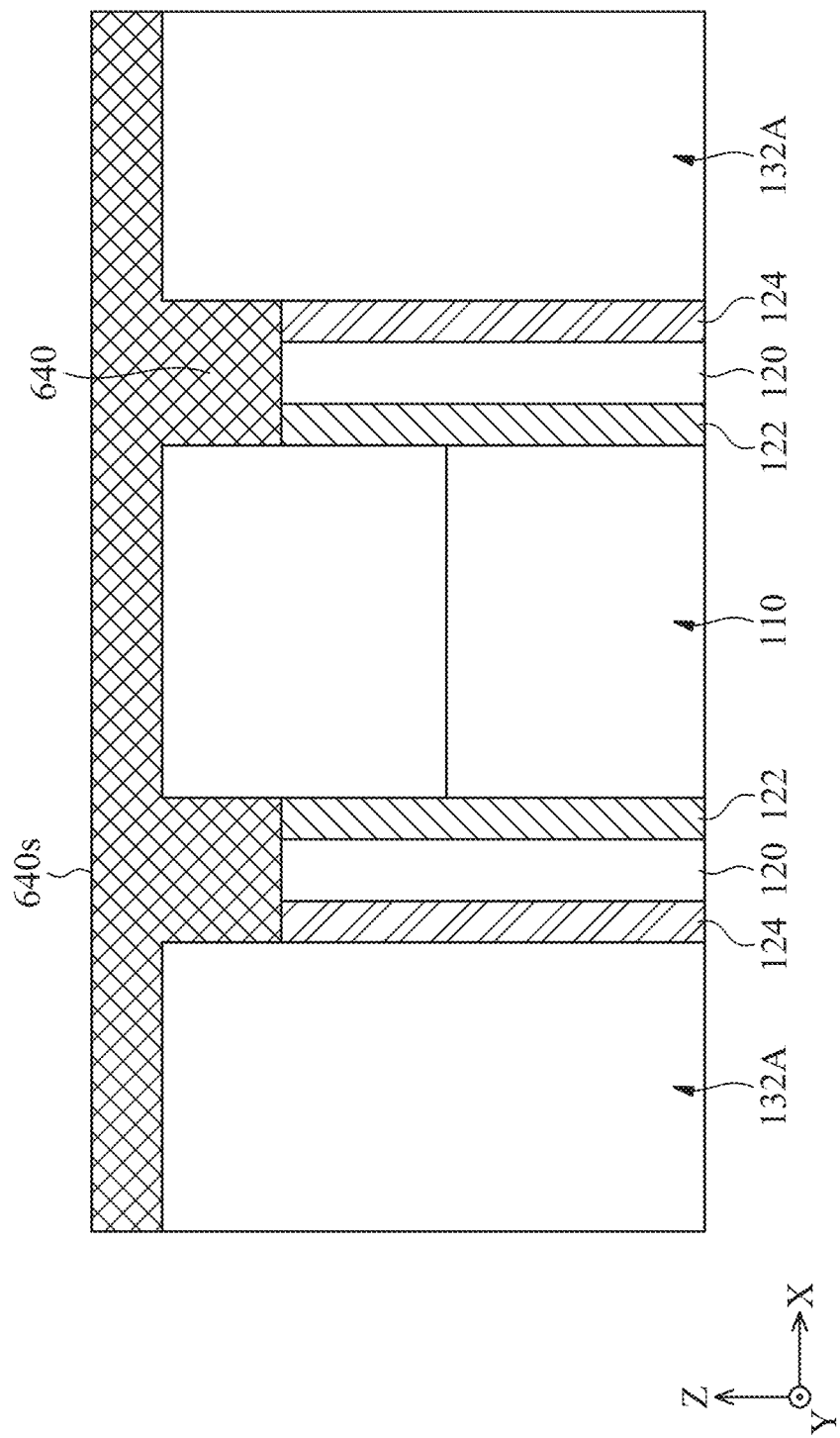

Referring to FIG. 2, in operation 240, a dielectric layer is spun on the air gap, the first spacer layer, and the second spacer layer to fill in the recess and seal the air gap. The dielectric layer includes raw materials (also referred to as "precursors") for a spin-on dielectric material. For example, as shown in FIG. 6, dielectric layer 640 can be spun on air gap 520, first spacer layer 122, second spacer layer 124, gate capping structure 134, and S/D contact structures 132A. The spin-on process may not fill openings less than about 7 nm. Recess 440 can have a width 440w ranging from about 7 nm to about 15 nm and air gap 520 can have a width 520w ranging from about 2 nm to about 5 nm. Therefore, the spin-on dielectric layer can fill in recess 440 but not air gap 520, forming dielectric layer 640 as shown in FIG. 6. In some embodiments, dielectric layer 640 can have substantially no seam after filling of recess 440. In some embodiments, depth 440d of recess 440 can control vertical dimension 120h of air spacers 120. In some embodiments, deposited by a spin-on process, dielectric layer 640 can have a planarized surface 640s across gate structure 110 and S/D contact structures 132A, which can help with subsequent polishing processes of dielectric layer 640. In some embodiments, surfactant materials can be added to the raw materials of the dielectric layer to improve coating uniformity. The surfactant materials can include F, which can be partially removed by a post-treatment process. The remaining F after the post-treatment process can contribute to the F concentration in the spin-on dielectric material.

In some embodiments, the dielectric layer can include a SiOC film that fills openings having a width not less than 7 nm. The raw materials in the dielectric layer can control the silicon, oxygen, and carbon concentrations in the spin-on dielectric material. In some embodiments, a single raw material can be used to form the spin-on dielectric material. In some embodiments, multiple raw materials can be used to form the spin-on dielectric material. In some embodiments, the raw materials of the spin-on dielectric material can include methyl groups ($-CH_3$) or ethyl groups ($-CH_2CH_3$). In some embodiments, the raw materials of the spin-on dielectric material can include oxysilane groups (Si—O—R, where R is one of H, $CH_3$, $C_2H_5$, and $C_3H_7$). In some embodiments, the raw materials of the spin-on dielectric material can include hydroxyl groups (—OH).

In some embodiments, a molecular weight of the raw materials can range from about 500 g/mol to about 10,000 g/mol. The molecular weight of the raw materials can have a positive correlation with the viscosity of the raw materials. If the molecular weight is less than about 500 g/mol, the raw materials may not form the dielectric layer with required thickness. If the molecular weight is greater than about 10,000 g/mol, the raw materials may not form a uniform dielectric layer. In some embodiments, the molecular weight of the spin-on dielectric material can be higher than the raw materials after an oxidization and polymerization treatment.

Figure 8A:
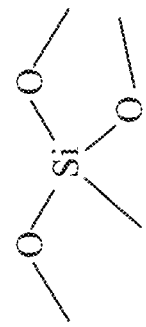
Figure 8B:
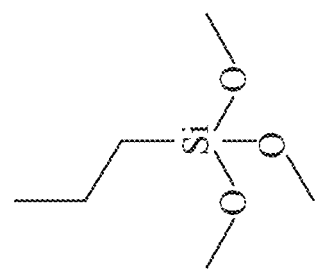
Figure 8D:
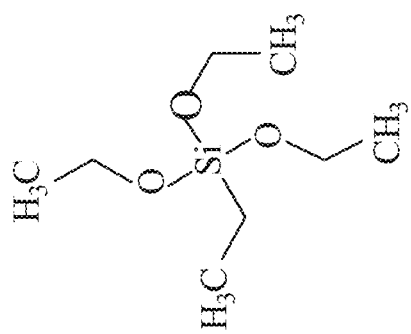

In some embodiments, one of the raw materials can be in the form of $Si(R)_x(OR')_y$, where each of R and R' can be one of H, $CH_3$, $C_2H_5$, and $C_3H_7$. In some embodiments, R can be the same as R'. In some embodiments, R can be different from R'. X and y can be positive integers and a sum of x and y can be equal to four. In some embodiments, $Si(R)_x(OR')_y$ can be $SiC_2H_5(OC_2H_5)_3$ as shown in FIG. 8A. In some embodiments, $Si(R)_x(OR')_y$ can be $SiC_3H_7(OCH_3)_3$ as shown in FIG. 8B. In some embodiments, $Si(R)_x(OR')_y$ can be $SiCH_3(OCH_3)_3$ as shown in FIG. 8C. In some embodiments, $Si(R)_x(OR')_y$ can be $SiC_2H_5(OCH_3)_3$ as shown in FIG. 8D.

Figure 8F:
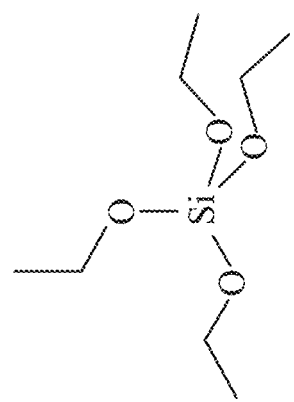
Figure 8G:
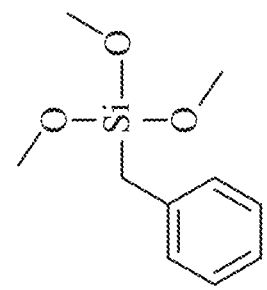

In some embodiments, one of the raw materials can be in the form of $Si(OR)_4$, where R can be one of $CH_3$ and $C_2H_5$. In some embodiments, $Si(OR)_4$ can be $Si(OCH_3)_4$ as shown in FIG. 8E. In some embodiments, $Si(OR)_4$ can be $Si(OC_2H_5)_4$ as shown in FIG. 8F. In some embodiments, one of the raw materials can be in the form of $SiC_7H_7(OR)_3$, where R can be one of $CH_3$ and $C_2H_5$. In some embodiments, $SiC_7H_7(OR)_3$ can be $SiC_7H_7(OCH_3)_3$ as shown in FIG. 8G.

The spin-on deposition of the dielectric layer can be followed by a post-treatment process of the raw materials in the dielectric layer. In some embodiments, the post-treatment process can include a baking process, a dry anneal process, an ultraviolet (UV) treatment process, a plasma treatment process, an ozone ($O_3$) soak process, or an ammonia ($NH_3$) treatment process.

In some embodiments, the baking and dry anneal processes can include heating the dielectric layer at a temperature ranging from about 300° C. to about 700° C. with a pressure ranging from about 1 Torr to about 760 Torr in a gas environment. In some embodiments, the baking process can include heating the dielectric layer by a hot plate with air. In some embodiments, the dry anneal process can include dry annealing the dielectric layer with nitrogen. If the temperature is lower than about 300° C., the raw materials may not be densified for the required spin-on dielectric material. If the temperature is higher than about 700° C., the gate electrode of gate structure 110 can be damaged. In some embodiments, the gas environment can include inert gases, such as helium (He), nitrogen ($N_2$), and argon (Ar). The inert gases can help with the densification of the raw materials in the post-treatment process. In some embodiments, the gas environment can include oxygen ($O_2$) to tune the composition of the spin-on dielectric material for more Si—O bonds. In some embodiments, the gas environment can include hydrogen ($H_2$) to prevent oxidation of the spin-on dielectric material and maintain the carbon concentration in the spin-on dielectric material.

In some embodiments, the UV treatment process can be performed on the raw materials of the dielectric layer at a temperature ranging from about 100° C. to about 500° C. in a gas environment. If the temperature is lower than about 100° C., the raw materials may not be densified for the required spin-on dielectric material. If the temperature is higher than about 700° C., the gate electrode of gate structure 110 can be damaged. In some embodiments, the gas environment can include inert gases, such as nitrogen ($N_2$) and argon (Ar). The inert gases can help with the densification of the raw materials in the post-treatment process. In some embodiments, the gas environment can include oxygen ($O_2$) to tune the composition of the spin-on dielectric material for more Si—O bonds. In some embodiments, the gas environment can include hydrogen ($H_2$) to prevent oxidation of the spin-on dielectric material and maintain the carbon concentration in the spin-on dielectric material.

In some embodiments, the plasma treatment process can use a direct plasma source or a remote plasma source, such as a capacitively coupled plasma (CCP) and an inductively coupled plasma (ICP). In some embodiments, the plasma treatment process can use a single plasma source or multiple plasma sources. In some embodiments, the plasma treatment process can be performed with a plasma power ranging from about 100 W to about 2000 KW. In some embodiments, the plasma treatment process can be performed at a pressure ranging from about 100 mTorr to about 20 Torr. In some embodiments, the plasma treatment process can be performed on the raw materials of the dielectric layer at a temperature ranging from about 50° C. to about 500° C. in a gas environment. If the temperature is lower than about 50° C., the raw materials may not be densified for the required spin-on dielectric material. If the temperature is higher than about 500° C., the gate electrode of gate structure 110 can be damaged. In some embodiments, the gas environment can include inert gases, such as helium (He) and argon (Ar). The inert gases can help with densification of the raw materials in the post-treatment process. In some embodiments, the gas environment can include nitrogen ($N_2$) or ammonia ($NH_3$) for nitrogenizing of the spin-on dielectric material. In some embodiments, the gas environment can include oxygen ($O_2$) to tune the composition of the spin-on dielectric material for more Si—O bonds. In some embodiments, the gas environment can include hydrogen ($H_2$) to prevent oxidation of the spin-on dielectric material and maintain the carbon concentration in the spin-on dielectric material.

In some embodiments, the $O_3$ soak process can be performed in an ozone environment at a temperature ranging from about 10° C. to about 500° C. If the temperature is lower than about 50° C., the raw materials may not be densified for the required spin-on dielectric material. If the temperature is higher than about 500° C., the gate electrode of gate structure 110 can be damaged. In some embodiments, the $O_3$ soak process and the UV treatment process can be performed together at a temperature ranging from about 0° C. to about 400° C. to improve oxidation efficiency of the post-treatment process.

In some embodiments, the $NH_3$ soak process can be performed in an ammonia environment at a temperature ranging from about 50° C. to about 700° C. If the temperature is lower than about 50° C., the raw materials may not be densified for the required spin-on dielectric material. If the temperature is higher than about 700° C., the gate electrode of gate structure 110 can be damaged.

In some embodiments, the raw materials of the dielectric layer can include $SiCH_3(OCH_3)_3$ and $Si(OCH_3)_4$, and the dielectric layer can be treated with the bake process and the UV process at a temperature ranging from about 300° C. to about 500° C. The formed spin-on dielectric material can have a carbon concentration ranging from about 15 atomic percent to about 25 atomic percent. The O/Si ratio of the formed spin-on dielectric material can range from about 2 to about 3. The fluorine concentration can be lower than about 0.05 atomic percent. The density of the spin-on dielectric material can range from about 1.2 g/cm³ to about 1.6 g/cm³. And the dielectric constant of the spin-on dielectric material can be lower than about 3, which can reduce the capacitance of the spacer structure between gate structure 110 and S/D contact structures 132A and 132B.

In some embodiments, the raw materials of the dielectric layer can include $SiCH_3(OCH_3)_3$ and $Si(OCH_3)_4$, and the dielectric layer can be treated with a two-step anneal process. The first step of the two-step anneal process can be performed in a reactive gas environment, such as oxygen and ammonia, to reduce the carbon concentration and increase the oxygen or nitrogen concentration in the spin-on dielectric material. The second step of the two-step anneal process can be performed in an inert gas environment to densify the spin-on dielectric material. The two-step anneal process can be performed at a temperature ranging from about 300° C. to about 500° C. The formed spin-on dielectric material can have a carbon concentration ranging from about 15 atomic percent to about 25 atomic percent. The O/Si ratio of the formed spin-on dielectric material can range from about 2 to about 3. The fluorine concentration can range from about 0.1 atomic percent to about 1.0 atomic percent. The density of the spin-on dielectric material can range from about 1.2 $g/cm^3$ to about 1.6 $g/cm^3$. And the dielectric constant of the spin-on dielectric material can be lower than about 4.

In some embodiments, the raw materials of the dielectric layer can include $SiCH_3(OCH_3)_3$, $Si(OCH_3)_4$, and $SiC_7H_7(OCH_3)_3$, and the dielectric layer can be treated with the bake process at a temperature ranging from about 300° C. to about 500° C. The formed spin-on dielectric material can have a carbon concentration ranging from about 20 atomic percent to about 30 atomic percent. The O/Si ratio of the formed spin-on dielectric material can range from about 1.5 to about 2.5. The fluorine concentration can be lower than about 0.05 atomic percent. The density of the spin-on dielectric material can range from about 1.1 $g/cm^3$ to about 1.6 $g/cm^3$. And the dielectric constant of the spin-on dielectric material can be lower than about 3.5.

Figure 7:
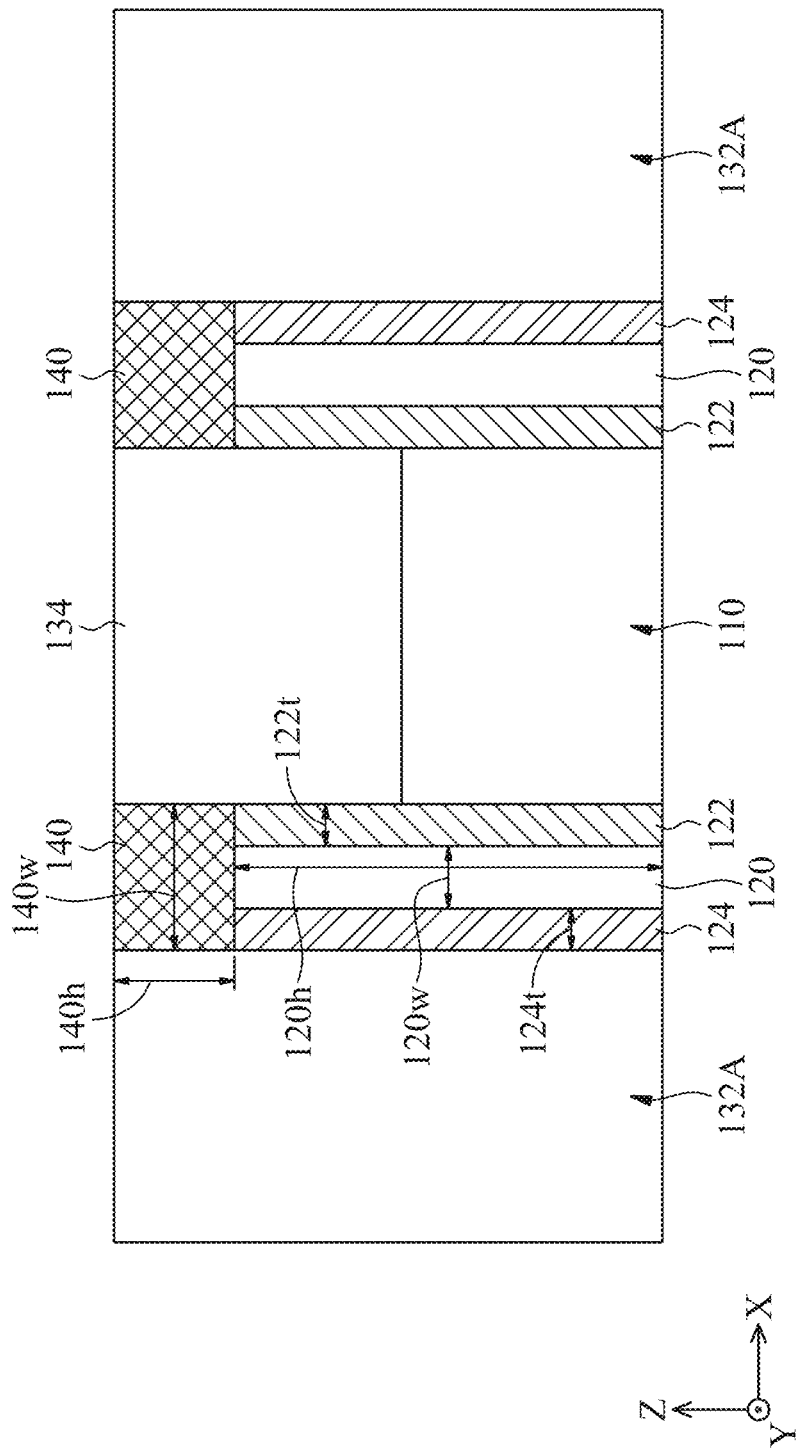

A chemical mechanical polishing (CMP) process can be performed after the post-treatment process of the spin-on dielectric layer to coplanarize a top surface of gate capping structure 134, spin-on dielectric structures 140, and S/D contact structures 132A. In some embodiments, the CMP process can stop on S/D contact structures 132A. In some embodiments, compared with dielectric layer deposited by CVD and ALD, the spin-on dielectric layer can have a planarized surface and can help the CMP process. After the CMP process, spin-on dielectric structures 140 can be formed as shown in FIG. 7, which is similarly shown and described above with respect to FIG. 1B. In some embodiments, spin-on dielectric structures 140 can seal a top opening of air-replaced spacers 120.

Various embodiments in accordance with the present disclosure provide methods for forming air spacers 120 with spin-on dielectric structures 140. According to some embodiments, air gap 520 can be formed between gate structure 110 and S/D contact structures 132A and 132B through deposition and removal of sacrificial spacer layer 320. In some embodiments, spin-on dielectric structures 140 can seal a top opening of air gap 520 and form air spacers 120. In some embodiments, spin-on dielectric structures 140 can be formed through spinning dielectric layer 640 (as shown in FIG. 6) on air gap 520 (of FIG. 5) and treating dielectric layer 640. In some embodiments, spin-on dielectric structures 140 can have substantially no seam after formation. In some embodiments, compared with ALD and CVD processes, dielectric layer 640 deposited by a spin-on process can have a planarized surface that can lower the difficulty of subsequent CMP process. In some embodiments, the spin-on process may not fill openings having a width less than about 7 nm, and recess 440 can be formed in sacrificial spacer layer 320 and first and second spacer layers 122* and 124* to control the air spacer dimensions.

In some embodiments, a method includes forming an intermediate spacer structure between a gate structure and a source/drain (S/D) contact structure and removing a top portion of the intermediate spacer structure to from a recess. The intermediate spacer structure includes a first spacer layer, a second spacer layer, and a sacrificial spacer layer between the first and second spacer layers, The method further includes removing the sacrificial spacer layer to form an air gap between the first spacer layer and the second spacer layer and spinning a dielectric layer on the air gap, the first spacer layer, and the second spacer layer to fill in the recess and seal the air gap. The dielectric layer includes raw materials for a spin-on dielectric material.

In some embodiments, a method includes forming a first spacer layer on a sidewall of a gate structure, forming a sacrificial spacer layer adjacent to the first spacer layer, forming a second spacer layer adjacent to the sacrificial spacer layer, and forming a source/drain (S/D) contact structure. The first spacer layer, the sacrificial spacer layer, and the second spacer layer are between the S/D contact structure and the gate structure. The method further includes selectively etching a top portion of one or more of the first spacer layer, the sacrificial spacer layer, and the second spacer layer to form a recess, removing the sacrificial spacer layer to form an air gap between the first spacer layer and the second spacer layer, spinning a dielectric layer on the air gap, the first spacer layer, and the second spacer layer to fill in the recess and seal the air gap, treating the raw materials in the dielectric layer to form the spin-on dielectric material, and polishing the dielectric layer to form a spin-on dielectric structure. The dielectric layer includes raw materials for a spin-on dielectric material.

In some embodiments, a semiconductor device includes a gate structure on a substrate, a source/drain (S/D) contact structure adjacent to the gate structure, and a spacer structure between the gate structure and the S/D contact structure. The spacer structure includes a first spacer layer, a second spacer layer, an air spacer between the first and the second spacer layers, and a spin-on dielectric structure sealing the air spacer. A top surface of at least one of the first and the second spacer layers is in contact with a bottom surface of the spin-on dielectric structure.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a gate structure on a substrate;

a gate capping structure on the gate structure;
a source/drain (S/D) contact structure adjacent to the gate structure and the gate capping structure; and
a spacer structure between the gate capping structure and the S/D contact structure, wherein:
the spacer structure comprises a first spacer layer, a second spacer layer, an air spacer between the first and the second spacer layers, and a spin-on dielectric structure sealing the air spacer;
a top surface of at least one of the first and the second spacer layers is in contact with a bottom surface of the spin-on dielectric structure; and
the spin-on dielectric structure is in contact with at least one of a sidewall of the gate capping structure and a sidewall of the S/D contact structure.

2. The semiconductor device of claim 1, wherein the first spacer layer and the spin-on dielectric structure are in contact with the gate capping structure, and wherein the top surface of the first spacer layer is in contact with the bottom surface of the spin-on dielectric structure.

3. The semiconductor device of claim 1, wherein the second spacer layer and the spin-on dielectric structure are in contact with the S/D contact structure, and wherein the top surface of the second spacer layer is in contact with the bottom surface of the spin-on dielectric structure.

4. The semiconductor device of claim 1, wherein the spin-on dielectric structure is in contact with the gate capping structure and the S/D contact structure, and wherein the top surfaces of the first and the second spacer layers are in contact with the bottom surface of the spin-on dielectric structure.

5. The semiconductor device of claim 1, wherein the spin-on dielectric structure comprises a spin-on dielectric material comprising silicon, oxygen, carbon, hydrogen, and fluorine.

6. The semiconductor device of claim 5, wherein a carbon concentration of the spin-on dielectric material ranges from about 2 atomic percent to about 30 atomic percent.

7. The semiconductor device of claim 5, wherein a ratio of the oxygen to the silicon ranges from about 1.5 to about 3.0.

8. The semiconductor device of claim 1, wherein a ratio of a height of the spin-on dielectric structure to a height of the spacer structure ranges from about 0.04 to about 0.6.

9. The semiconductor device of claim 1, wherein a ratio of a width of the air spacer to a width of the first spacer layer ranges from about 0.2 to about 5.

10. A semiconductor device, comprising:
a first spacer layer on a sidewall of a gate capping structure;
a second spacer layer on a sidewall of a source/drain (S/D) contact structure;
an air spacer between the first and second spacer layers; and
a spin-on dielectric structure sealing the air spacer between the first and second spacer layers, wherein:
top surfaces of the spin-on dielectric structure, the S/D contact structure, and the gate capping structure are coplanar; and
the spin-on dielectric structure is in contact with at least one of the sidewall of the gate capping structure and the sidewall of the S/D contact structure.

11. The semiconductor device of claim 10, wherein the spin-on dielectric structure is in contact with the sidewall of the gate capping structure, a top surface of the first spacer layer, and a sidewall of the second spacer layer.

12. The semiconductor device of claim 10, wherein the spin-on dielectric structure is in contact with the sidewall of the S/D contact structure, a top surface of the second spacer layer, and a sidewall of the first spacer layer.

13. The semiconductor device of claim 10, wherein the spin-on dielectric structure is in contact with the sidewalls of the gate capping structure and the S/D contact structure and top surfaces of the first and the second spacer layers.

14. The semiconductor device of claim 10, wherein the spin-on dielectric structure comprises a spin-on dielectric material comprising silicon, oxygen, carbon, hydrogen, and fluorine.

15. The semiconductor device of claim 14, wherein a ratio of the oxygen to the silicon ranges from about 1.5 to about 3.0.

16. The semiconductor device of claim 10, wherein a ratio of a width of the air spacer to a width of the first spacer layer ranges from about 0.2 to about 5.

17. A semiconductor device, comprising:
a gate structure on a substrate;
a gate capping structure on the gate structure;
a spacer structure on sidewalls of the gate structure and the gate capping structure, wherein the spacer structure comprises a first spacer layer, a second spacer layer, an air spacer between the first and second spacer layers, and a spin-on dielectric structure sealing the air spacer, wherein the first spacer layer is in contact with the sidewalls of the gate structure and the gate capping structure; and
a source/drain (S/D) contact structure in contact with the second spacer layer, wherein the spin-on dielectric structure is in contact with at least one of a sidewall of the gate capping structure and a sidewall of the S/D contact structure.

18. The semiconductor device of claim 17, wherein top surfaces of the spacer structure, the S/D contact structure, and the gate capping structure are coplanar.

19. The semiconductor device of claim 17, wherein the spin-on dielectric structure comprises a spin-on dielectric material comprising silicon, oxygen, carbon, hydrogen, and fluorine.

20. The semiconductor device of claim 19, wherein a ratio of the oxygen to the silicon ranges from about 1.5 to about 3.0.

* * * * *